United States Patent
Kinoshita et al.

[11] Patent Number: 4,881,044
[45] Date of Patent: Nov. 14, 1989

[54] AMPLIFYING CIRCUIT

[75] Inventors: Taizo Kinoshita; Satoshi Tanaka, both of Kokubunji; Hirotoshi Tanaka, Kitatsuru; Nobuo Kotera, Kokubunji; Minoru Nagata, Kodairashi, all of Japan

[73] Assignee: Hitachi, Ltd., Tokyo, Japan

[21] Appl. No.: 139,790

[22] Filed: Dec. 30, 1987

[30] Foreign Application Priority Data

Jan. 16, 1987 [JP] Japan .................................. 62-5982

[51] Int. Cl.⁴ .............................................. H03F 3/45
[52] U.S. Cl. .................................. 330/253; 330/261; 330/277
[58] Field of Search .............. 330/252, 253, 254, 260, 330/261, 277

[56] References Cited
U.S. PATENT DOCUMENTS 4,785,259 11/1988 Seelbach ............................. 330/253

Primary Examiner—Gene Wan
Attorney, Agent, or Firm—Antonelli, Terry & Wands

[57] ABSTRACT

A wide-band and high-gain differential amplifier adapted to amplifying transmitted optical signals of the GHz band is constituted by GaAs MESFET's.

Two MESFET's Q1 and Q2 are differentially connected to each other. Drains of Q1 and Q2 are connected to load resistances $R_L$ and $R_L$ via a source-drain path of other MESFET's Q3 and Q4 whose gates are grounded in AC-wise.

Current by-passing means 4, 4 are connected to the sources of other MESFET's Q3, Q4. DC bias currents of the differential pair of MESFET's Q1, Q2 are set to relatively large values to increase the mutual conductance gm of the differential pair of MESFET's Q1, Q2. Despite a large DC bias current, the current by-passing means 4, 4 decrease the DC voltage drops across the load resistances $R_L$, $R_L$, and enable the differntial amplifier to operate on a low power source voltage.

11 Claims, 6 Drawing Sheets

AMPLIFYING CIRCUIT

BACKGROUND OF THE INVENTION

1. Field of the Invention

The present invention relates to an amplifying circuit, and to means which enables a differential amplifier to exhibit a high gain or a variable gain, and more specifically relates to a wide-band and high-gain amplifier which is adapted to realizing a high-speed transmission circuit such as of optical transmission in a highly integrated form.

2. Description of the Prior Art

Figure 2:
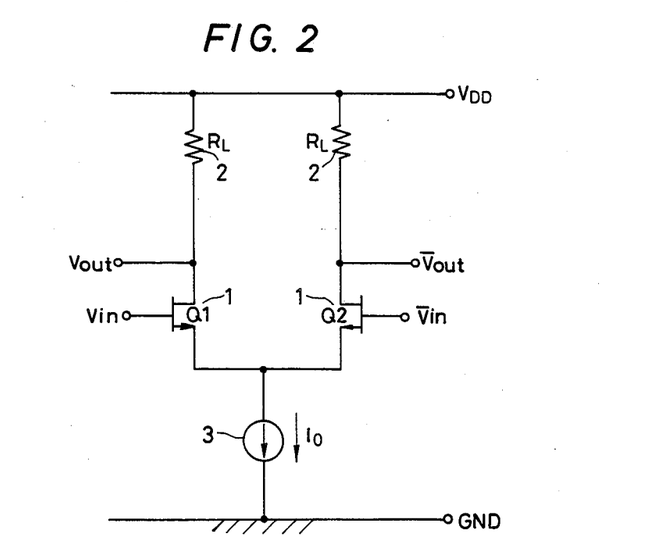
FIG. 2 is a diagram of a widely known amplifying circuit.

A conventional differential amplifier consists of a set of differential pair transistors, load resistances connected to a differential pair of drains, and a constant current source connected to the sources as disclosed, for example, in Japanese Association of Electronic Communications, Association of Microwave Study, MW81-88, p. 30, "GaAsIC High-speed Frequency Divider by a low-power Source-Coupled FET Logic (SCFL)". Output signals are produced as voltage drops across the load resistances by utilizing the fact that a current from a constant current source is distributed depending upon the individual gate input voltage differences of the differential pairs. FIG. 2 illustrates the structure of a conventional circuit wherein if load resistances are denoted by $R_L$, a constant current by $I_o$, differential pair transistors by Q1 and Q2, a mutual conductance by gm, and a K value by K, then a voltage gain Gv is given by the following equation, $$Gv = gm \cdot R_L \tag{1}$$

SUMMARY OF THE INVENTION

In the case of a differential amplifier employing bipolar transistors, the mutual conductance gm is given by the following equation, $$gm = 1 / \left( \frac{q}{kT} + re \right) \tag{2}$$

where
- q denotes an electron charge, k denotes a Boltzmann constant,
- T denotes an absolute temperature, and re denotes an emitter resistance.

Therefore, the mutual conductance gm is about 40 millisiemens which is a gain of about 20 times as great when the load resistance is $R_L = 500$ ohms.

In the case of a differential amplifier employing field-effect transistors (hereinafter referred to as FET's), on the other hand, the mutual conductance gm is given by the following equation, $$gm = \sqrt{\frac{KI_o}{2}} + 1/Rs \tag{3}$$

where Rs denotes a source resistance.

Therefore, the mutual conductance is about 5 millisiemens which is a gain of about 2.5 times as great for the same load resistance. Namely, it was found by the present inventors that the gain decreases to about one-eighth compared with when bipolar transistors are used.

As described above, the bipolar transistors exhibit a large mutual conductance gm due to the fact that the collector current or the emitter current exponentially increases with the increase in the base-emitter voltage, and the FET's exhibit a small mutual conductance gm due to the fact that the drain current or the source current increases at a rate of square power with the increase in the gate-source voltage.

As described above, the bipolar transistors exhibit such a large mutual conductance that an amplifier of a single-stage construction produces a large gain. With the FET circuit, on the other hand, the mutual conductance gm is smaller than that of the bipolar circuit, and the gain decreases to about one-eighth even when the same load resistance is used. Therefore, when it is desired to obtain a large gain with the FET amplifier circuit, it is necessary to increase the stage number of connections of a multi-stage amplifier. It was, however, discovered by the present inventors that the amplification band width becomes narrower as the stage number of connections of the multi-stage amplifier increases. This stems from the following fact. That is, an amplifying element such as a bipolar transistor or an FET in each stage of the multi-stage amplifier inevitably exhibits a phase shift in relation to the amplifying operation (e.g., current gain). A frequency at which a high-frequency current gain becomes smaller by $-3dB$ than a low-frequency gain is called cut-off frequency. The amplitude of an amplified output signal decreases for input signals of a frequency higher than the cut-off frequency, and the delayed phase shift becomes great. Therefore, the increase in the stage number of connections of the multi-stage amplifier causes an increase in the connection number of amplifying elements on a signal transmission path from the total input of the multi-stage amplifier to the total output thereof. This means that a cut-off frequency of the total amplification factor of the multi-stage amplifier greatly decreases compared with the cut-off frequency of the amplification factor of a single amplifying element, so that the amplifying band width of the multi-stage amplifier is narrowed.

Furthermore, an increase in the stage number of connections of the multi-stage amplifier involves another problem. That is, when the output of a preceding stage amplifier is connected to the input of a succeeding stage amplifier, a time constant is formed by the product of an output resistance of the output and an input capacitance of the input. An increase in the stage number of connections causes the time constant to increase which, then, causes the total amplification band width of the multi-stage amplifier to become narrow. This becomes conspicuous when a multi-stage amplifier is constituted using FET's that have a relatively large gate capacitance. The mutual conduction gm of FET varies in proportion to the gate width. By using the FET having a large gate width, therefore, a large gain can be obtained causing, however, the gate capacitances Cgs, Cgd to increase, which results in a great reduction in the band width.

If the mutual conductance of an amplifying element is denoted by gm and the load resistance by $R_L$, a voltage gain Gv of an amplifier circuit which consists of this amplifying element and load resistance is given by $Gv = gm \cdot R_L$. Therefore, the voltage gain Gv can be increased by increasing the load resistance $R_L$. However, a large time constant is formed by the large load resistance and a Miller capacitance between the input and the output of amplifying element (e.g., Miller capacitance between the base and the collector or Miller capacitance between the gate and the drain), which narrows the band width of the amplifier circuit.

The present invention was accomplished in view of the above-mentioned circumstances, and its principal object is to increase the gain of a single-stage amplifier.

Another object of the present invention is to realize a multi-stage amplifier which features a large gain and a wide band by employing an amplifier having an increased gain in a multi-stage amplifier.

Further objects and novel features of the present invention will be comprehended easily from the following description.

[Means for Solving the Problems]

The above principal object is achieved fundamentally by increasing a DC bias current of the amplifying element. That is, the mutual conductance gm of the amplifying element increases in proportion to the increase in the bias current. In the bipolar transistor, for example, the emitter resistance re decreases with the increase in the bias current, and the mutual conductance gm increases in compliance with the aforementioned equation (2). In the case of the FET, on the other hand, the mutual conductance gm increases with the increase in the bias current Io in compliance with the aforementioned equation (3).

Thus, the mutual conductance gm increases with the increase in the bias current, and hence the voltage gain Gv increases.

In an amplifier circuit, however, an amplifying element and a load resistance are connected in series with each other. Therefore, if the DC bias current of the amplifying element is increased, the DC voltage drop across the terminals of the load resistance increases, too. Therefore, there develops inconvenience in that the power source voltage necessary for operating the amplifier circuit must be increased to meet the increased DC voltage drop.

To alleviate such inconvenience, the present invention fundamentally has the following features.

That is, the output electrode (e.g., collector or drain) of a first amplifying element (e.g., bipolar transistor or FET) is connected to an end of a load means (e.g., resistor), the other end of the load means is connected to a first operating potential (e.g., positive power source voltage $V_{DD}$), and the grounding electrode (e.g., emitter or source) of the first amplifying element is connected to a second operating potential (e.g., grounding voltage GND). The DC bias current of the first amplifier element is set to a large value so that the first amplifier element will have a large conductance. Further, a current by-passing means is connected to a connection node between the load means and the output electrode of the first amplifying element such that part of the DC bias current is by-passed. The input electrode and the grounding electrode of the first amplifying element respond to an input signal.

According to an improved embodiment of the present invention, there is arranged a first additional amplifying element (e.g., bipolar transistor or FET) having an input electrode (e.g., base or gate) that is grounded AC-wise. The grounding electrode (e.g., emitter or source) of the first additional amplifying element is connected to the output electrode of the first amplifying element, and the output electrode (e.g., collector or drain) of the first additional amplifying element is connected to an end of the load means. This helps avoid the direct connection between the output electrode of the first amplifying element and the load means, and whereby a large time constant is not formed by the load means and by the Miller capacitance of the amplifying element.

According to the improved embodiment of the present invention, furthermore, the current by-passing means is connected to the grounding electrode of the first additional amplifying element. If the current by-passing means is connected to the output electrode of the first additional amplifying element, the load means and the current by-passing means are connected in parallel with each other. The impedance of parallel connection is smaller than the impedance of the load means, and thereby the voltage gain Gv decreases. The impedance as viewed from the grounding electrode of the first additional amplifying element whose input electrode is AC-wise grounded is sufficiently smaller than the impedance of the current by-passing means. Therefore, most of the alternating current that flows through the output electrode of the first amplifying element flows into the grounding electrode of the first additional amplifying element; i.e., very little alternating current flows into the current by-passing means and substantially a direct current only flows into the current by-passing means. This helps prevent the voltage gain Gv from decreasing. Moreover, a small AC impedance in the grounding electrode of the first additional amplifying element helps avoid the formation of a large time constant by a relatively large impedance of the current by-passing means and by the Miller capacitance of the first amplifying element.

[Action]

According to the fundamental feature of the present invention, a DC bias current that flows into the first amplifying element is set to a relatively large value, whereby the mutual conductance gm of the first amplifying element assumes a large value, and a single-stage amplifying circuit that includes the first amplifying element exhibits an increased amplification factor. Further, the current by-passing means by-passes the load means to flow at least part of the DC bias current. Therefore, the DC voltage drop across the load means can be decreased, and the power source voltage for the amplifying circuit needs not be so increased.

DESCRIPTION OF THE PREFERRED EMBODIMENTS

Figure 1:
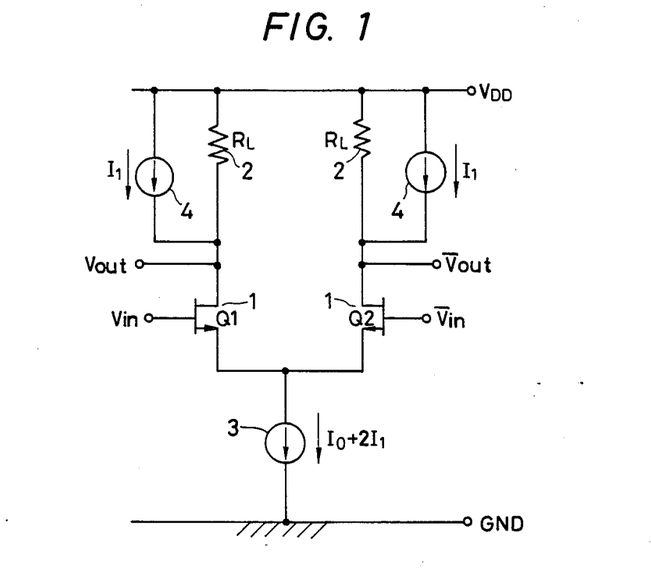
FIG. 1 is a diagram illustrating an amplifying circuit according to an embodiment of the present invention.

FIG. 1 is a diagram of an amplifying circuit according to an embodiment of the present invention. The amplifying circuit can be used as an amplifier of any stage in the multi-stage amplifier.

In FIG. 1, a first amplifying element 1 consists of FET's Q1 and Q2 whose sources are differentially connected to each other, and a load means 2 consists of a pair of resistances $R_L$. It is essential that the impedance of current by-passing means 4 is greater than the impedance of load means 2. According to this embodiment, therefore, the current by-passing means 4 is constituted by constant-current sources that supplies a direct current $I_1$, and may be replaced by any other means such as a resistor having a large resistance. To the sources of the differential pair of FET's Q1 and Q2 is connected a constant-current source that supplies a direct current and that serves as a source common impedance means 3. The common impedance means 3 may be substituted by a resistance. That is, in FIG. 1, to the drain of the differential pair of FET's Q1 and Q2 are connected the load resistance $R_L$ and another constant-current source 4.

If the direct current of the constant-current source 4 is denoted by $I_1$, the constant-current source 3 connected to the sources of the differential pair of FET's is so constructed as to cause a current $I_O+2I_1$ to flow, to obtain an increased voltage gain Gv. The gain can be adjusted by the current $I_1$.

In FIG. 1, as described above, the constantcurrent source 4 is connected to the drains of the differential pair of FET's Q1 and Q2, and a direct current is supplied to the FET's Q1 and Q2 to obtain a large gain. If now the current of the constantcurrent source 3 connected to the sources of the differential pair of FET's Q1 and Q2 is denoted by $I_O$, K values of the transistors Q1 and Q2 by K, and the load resistance by $R_L$, the gain is given by the equations (1) and (3) when the current of the constant-current source 4 is $I_1=0$. In the equation (3), if the second term 1/Rs is neglected in comparison with the first term, then there is obtained the following equation, $$G_v = \sqrt{\frac{K \cdot I_O}{2}} \cdot R_L \qquad (4)$$

However, when the constant current $I_1$ which is not zero is supplied from the constant-current source 4, the above equation is rewritten as, $$G_v = \sqrt{\frac{K \cdot (I_O + 2I_1)}{2}} \cdot R_L \qquad (5)$$

and the gain is increased by $$\sqrt{\frac{I_O + 2I_1}{I_O}}$$

times. The electric current $I_O$ only contributes to the output amplitude, and the output amplitude is $V_O=R_L \cdot I_O$. Therefore, the DC voltage drop does not increase across the load 4 and the band width is not narrowed despite the increase in the gain Gv. That is, addition of the constant current $I_1$ helps increase the mutual conduction gm only of the differential pair of FET's Q1 and Q2, to obtain an increased gain.

Figure 3:
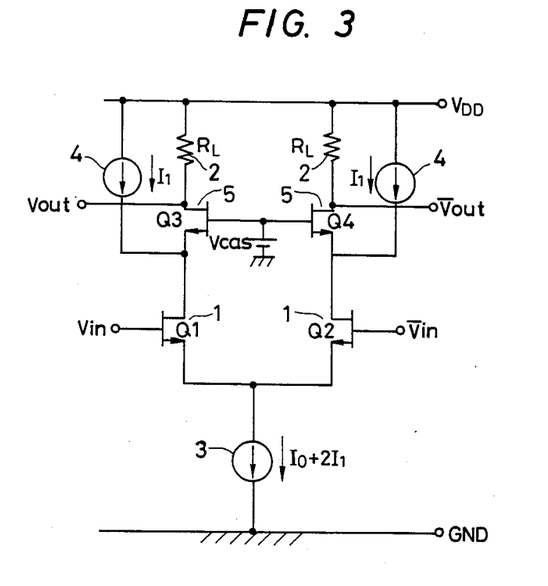
FIG. 3 is a diagram of an amplifying circuit according to an embodiment which is an improvement of the embodiment of FIG. 1.

FIG. 3 illustrates a modified embodiment which is an improvement from the embodiment of FIG. 1, and wherein a first additional amplifying element 5 is constituted by FET's Q3 and Q4 whose gates are grounded in AC-wise. AC grounding of the gates of FET's Q3 and Q4 is realized by applying a predetermined DC voltage Vcas to the gates.

What makes the embodiment of FIG. 3 different from the fundamental circuit structure of FIG. 1 is that a differential pair of FET's Q3 and Q4 whose gates are grounded are connected between the drains of the differential pair of FET's Q1, Q2 and the load resistances $R_L$. In FIG. 1, the alternating current component $I_O$ flows entirely through the load resistance $R_L$ when the additional constant-current source circuit 4 has an impedance that is sufficiently greater in AC-wise than the load resistance $R_L$, so that an AC amplitude $R_L \cdot I_O$ is produced as theoretical. However, when the constant-current source 4 does not have a sufficiently high impedance, part of the alternating current $I_O$ flows into the constant-current source 4 and the AC output amplitude decreases.

The AC output amplitude, however, can be prevented from decreasing if sources of the additional FET's Q3 and Q4 are connected in cascade to the drains of the differential pair of FET's Q1 and Q2 as shown in FIG. 3. That is, the impedance as viewed from the sources of the additional FET's Q3, Q4 whose gates are grounded in AC-wise, is very smaller than that of the impedance means of the constant-current source 4, and the alternating current flowing into the drains of the differential pair of FET'Q1, Q2 flows mostly into the load resistance $R_L$ via source-drain paths of the additional FET's Q3, Q4, but does substantially flow into the constant-current source 4. Therefore, the AC output amplitude is prevented from decreasing.

In FIG. 3, furthermore, sources of the additional FET's Q3, Q4 are connected to drains of the differential pair of FET's Q1, Q2 forming a low impedance in an AC sense as viewed from the sources of the additional FET's Q3, Q4. Therefore, a large time constant is not formed by the load resistance $R_L$ or the constant-current source 4 and the mirror capacitance of the differential pair of FET's Q1, Q2.

In FIG. 3, the differential pair of FET's Q1, Q2 and the additional FET's Q3, Q4 can be replaced by the differential pair of bipolar transistors and additional bipolar transistors to obtain a differential amplifying circuit that features a wide band and a large gain. In this case, it needs not be pointed out that the connections of drains, gains and sources of FET's correspond to connections of collectors, bases and emitters of bipolar transistors, respectively.

Figure 4:
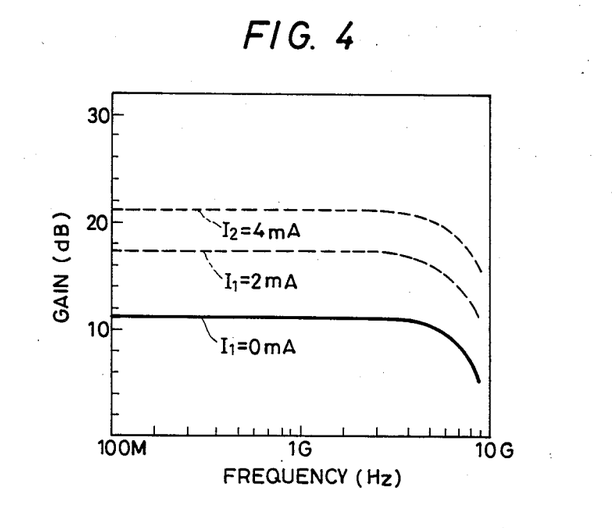
FIG. 4 is a diagram showing gain vs. frequency characteristics of the embodiment of FIG. 3.

FIG. 4 illustrates gain-frequency characteristics of the circuit of FIG. 3 according to the present invention in comparison with gain-frequency characteristics of when the current $I_1$ is zero in the circuit of FIG. 3. The circuit constants are as follows: the gate width of FET's Q1 to Q4 is 120 μm, $I_O=1$ mA, $R_L=1$ kiloohms, $I_1=0$ to 4 mA. As will be obvious from FIG. 4, the gain is 11 dB and the band width is 8 GHz when $I_1=0$ mA. When $I_1=4$ mA, on the other hand, the gain is 21 dB and the band width is 8 GHz, making it possible to realize a gain of greater than 10 dB without narrowing the band width.

Figure 5:
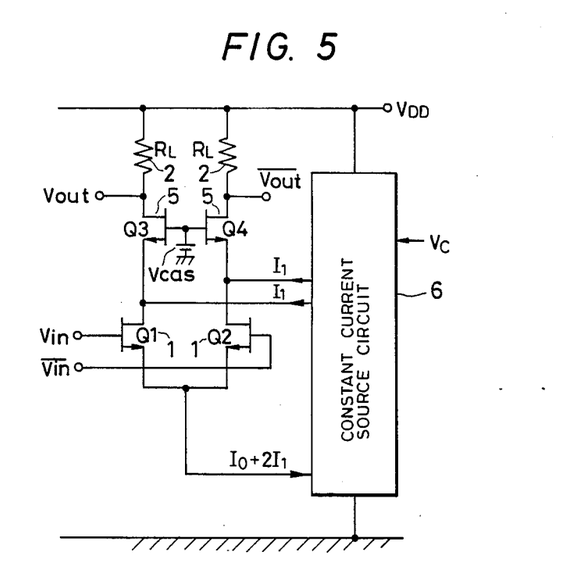
FIG. 5 is a circuit diagram of a variable gain amplifying circuit according to another embodiment of the present invention.

FIG. 5 illustrates another embodiment of the present invention provided with a constant-current source 6 of which the current $I_1$ can be controlled relying upon a control voltage Vc supplied from the external side. In this circuit, provision is made of a constant-current source circuit 6 which, in response to the change in the control voltage Vc, supplies the current $I_1$ to the drains of FET's Q1, Q2 and absorbes the current $I_O+2I_1$ through sources of FET's Q1, Q2, in order to change the current $I_1$. That is, a variable gain amplifier is constituted to obtain a gain that varies in compliance with the equation (5). In the case of FIG. 5, a variable gain width of 10 dB can be obtained.

Figure 6:
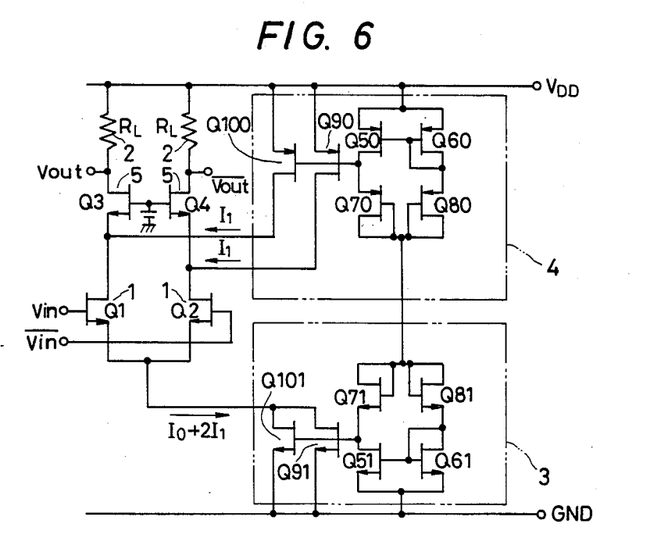
FIG. 6 is a diagram which concretely illustrates constant-current source circuits 3 and 4 employed in the embodiment of FIG. 3.

FIG. 6 illustrates constant-current source circuits 3, 4 employed in the embodiment of FIG. 3. In FIG. 6, the constant-current source 3 is constituted by n-channel FET's Q51, Q61, Q71, Q81, Q91 and Q101, and the constant-current source 4 is constituted by p-channel FET's Q50, Q60, Q70, Q80, Q90 and Q100. Here, the transistors Q70 and Q71 have a threshold value Vth1, other transistors have a threshold value Vth2, the transistors Q50 and Q51 have a gate width 4Wg1, the transistor Q91 has a gate width 2Wg1, the transistor Q101 has a gate width Wg2, and other transistors have a gate width Wg1. If a difference between the threshold value Vth1 and the threshold value Vth2 is denoted by ΔVth, the current $I_1$, i.e., $$I_1 = K(\Delta Vth)^2 \quad (6)$$

can be obtained by the constant-current source circuit 4, and the current $I_O+2I_1$ can be obtained by the constant-current source circuit 3 by suitably selecting the K value and the value ΔVth. Therefore, fabrication of an FET having a larger threshold value difference ΔVth plays an important role for obtaining a large gain.

Figure 7:
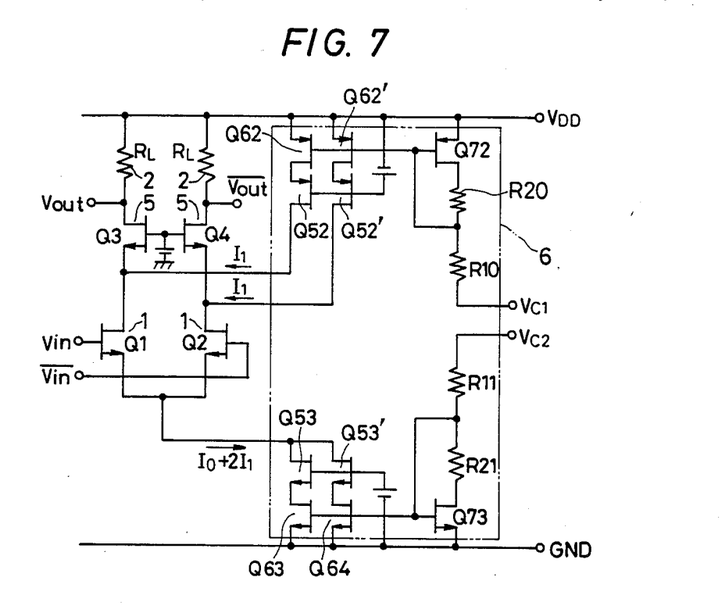
FIG. 7 is a diagram which concretely illustrates a constant-current source circuit 6 employed in the embodiment of FIG. 5.

FIG. 7 illustrates the structure of the constantcurrent source circuit 6 of the other embodiment of FIG. 5. In FIG. 7, symbols Q52, Q52', Q62, Q62', and Q72 denote p-channel FET's, and symbols Q53, Q53', Q63, Q64, and Q73 denote n-channel FET's. The transistor Q63 has a gate width 2Wg1, the transistor Q64 has a gate width Wg2, and other transistors all have a gate width Wg1. In this structure, suitable resistances R10 to R20 and gate widths are designed to adjust the control voltages Vc1 and Vc2, in order to vary the gain. In this case, a variable gain amplifier having a wide range for varying the gain can be constituted by increasing the gate width Wg1 with respect to the gate width Wg2.

Figure 8:
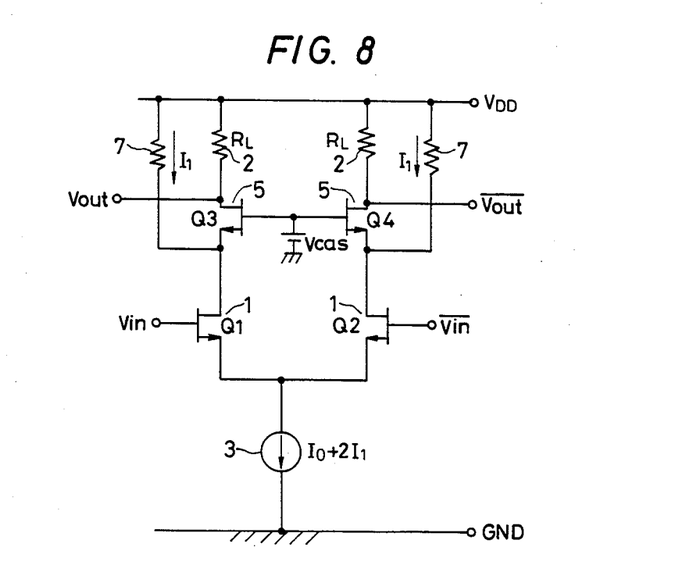
FIG. 8 is a circuit diagram according to a further embodiment which is modified from the embodiment of FIG. 1.

FIG. 8 illustrates the most simply modified structure in accordance with the embodiment of FIG. 3. Resistors 7 are inserted in place of the constantcurrent sources 4. The resistors 7 having a resistance of greater than several hundred ohms can be regarded to serve as constant-current sources, since the alternating current flows almost all through the load resistances $R_L$. Therefore, the effects mentioned in connection with FIG. 4 can be obtained with the simplest structure.

Figure 9:
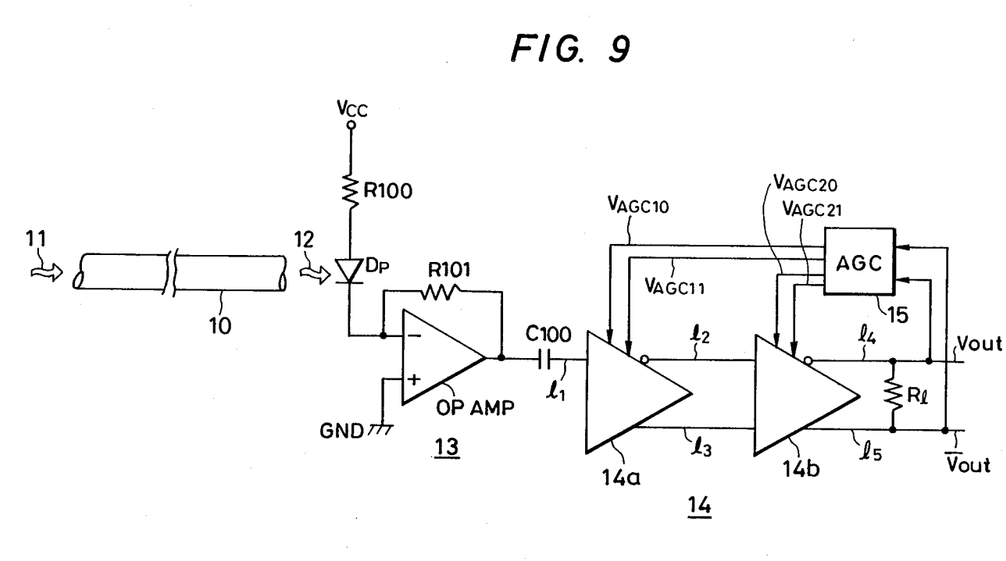
FIG. 9 is a block diagram of a system according to the embodiment employing a variable gain multi-stage amplifier of a wide band and large gain for amplifying optical, transmission signals in an optical communications system.

FIG. 9 illustrates an embodiment of when a wideband and high-gain amplifier of the present invention is used for amplifying optical transmission signals in the optical communications system. In FIG. 9, an optical input signal 11 from a sending station is received through one end of an optical transmission path 10 and an optical output signal 12 is taken out from the other end of the optical transmission path 10. The optical output signal 12 is converted into an electric signal through an optoelectronic converting means 13 in which the optical output signal 12 is converted into a current signal by a photo diode Dp. The anode of the photo diode Dp is connected to the positive power source voltage Vcc via a current limiting resistance $R_{100}$. The cathode of the photodiode Dp is connected to an end of the resistance $R_{101}$ and to an inverting input terminal (−) of an operational amplifier OP AMP. A non-inverting input terminal (+) of the operational amplifier OP AMP is connected to ground voltage GND, and an output terminal of the operational amplifier OP AMP is connected to the other terminal of the resistance $R_{101}$. Thus, the resistance $R_{101}$ and the operational amplifier OP AMP constitute a current-voltage converting means which converts a current signal of the photo diode Dp into a voltage signal. The voltage signal has a band width of about 2.4 GHz and an amplitude of about 5 mV to 500 mV, and is transmitted to an input line $l_1$ of a wide-band and high-gain amplifier 14 via a coupling capacitance $C_{100}$. The amplifier 14 is constituted by a preceding amplifier 14a and a succeeding amplifier 14b that are connected in cascade. In response to a signal of the input line $l_1$, the preceding amplifier 14a produces a signal of the opposite phase and a signal of the same phase through the output lines $l_2$ and $l_3$. The signals of the output lines $l_2$ and $l_3$ serve as differential input signals for the succeeding amplifier 14b. In response to the signals of the output lines $l_2$ and $l_3$, the succeeding amplifier 14b produces a voltage signal $V_{OUT}$ of a phase opposite to the signal line $l_2$ and a signal $\overline{V_{OUT}}$ of the same phase through output lines $l_4$ and $l_5$. The signal $V_{OUT}$ and the signal $\overline{V_{OUT}}$ are in phase with, and in opposite phase with, the signal of the input $l_1$, respectively. A load resistance $R_l$ of about 50 ohms is connected to the output lines $l_4$ and $l_5$. An AGC control signal generator 15 that performs automatic gain control generates gain control signals $V_{AGC10}$, $V_{AGC11}$, $V_{AGC20}$ and $V_{AGC21}$ in response to a voltage difference between the lines $l_4$ and $l_5$. Owing to these gain control signals $V_{AGC10}$ to $V_{AGC21}$, the voltage gain $G_v$ of the amplifier 14 is so set that a voltage amplitude is maintained at about 1 volt across both terminals of the load resistance $R_l$.

Figure 10:
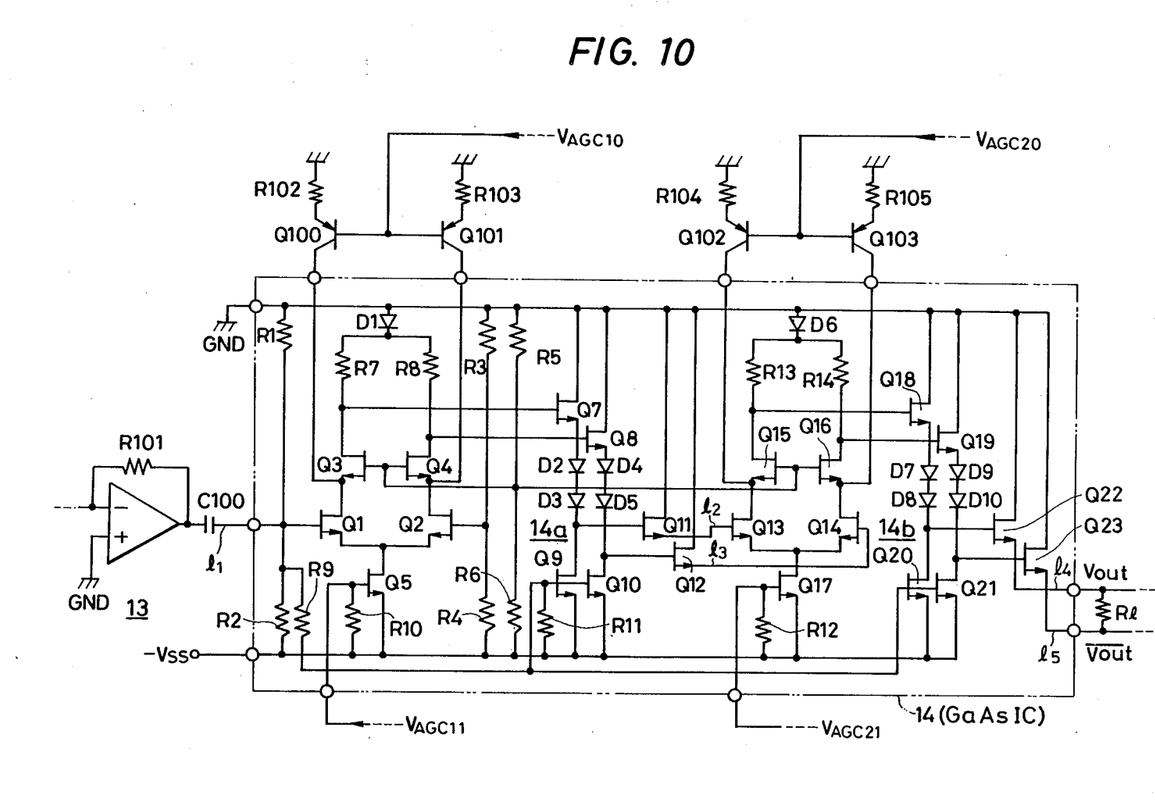
FIG. 10 is a circuit diagram which concretely illustrates the variable gain multi-stage amplifier employed in the embodiment of FIG. 9.

FIG. 10 is a circuit diagram which illustrates the amplifier 14 (preceding amplifier 14a, succeeding amplifier 14b) of FIG. 9 in further detail. The amplifier 14 consists of a GaAsIC, and the internal FET's Q1 to Q23 are constituted by n-channel GaAs MESFET's (metal semiconductor field effect transistors). The preceding amplifier 14a includes a differential pair of FET's Q1, Q2, additional FET's Q3, Q4, a constant-current source FET Q5, source follower FET's Q7, Q8, constant-current source FET's Q9, Q10, source follower FET's Q11, Q12, pnp-type transistors Q100, Q101, level shift diodes D1 to D5, and resistances R1 to R11. The pnp-type transistors Q100, Q101 whose bases are controlled by the gain control signal $V_{AGC10}$ constitute a current bypassing means. The gate of the constant-current source FET Q5 is controlled by the gain control signal $V_{ACG11}$. The source follower FET's Q7, Q8, Q11 and Q12 work as impedance converting means of high input impedance and low input impedance for improving the driving capabilities on the output lines $l_2$ and $l_3$.

The succeeding amplifier 14b includes differential pair of FET's Q13, Q14, additional FET's Q15, Q16, a constant-current source FET Q17, source follower FET's Q18, Q19, constant-current source FET's Q22, Q23, pnp-type transistors Q102, Q103, level shift diodes D6 to D10, and resistances R12 to R14. The pnp-type transistors Q102 and Q103 whose bases are controlled by the gain control signal $V_{AGC20}$, similarly, constitute a current by-passing means. The gate of the constant-current source FET Q17 is controlled by the gain control signal $V_{AGC21}$. The source follower FET's Q18, Q19, Q22 and Q23 work as impedance converting means to improve driving capabilities on the output lines $l_4$ and $l_5$.

As the voltage amplitude decreases across both terminals of the load resistance $R_l$, the gain control signals $V_{AGC10}$, $V_{AGC20}$ generated from the AGC control signal generator 15 decrease, and whereby the gain control signals $V_{AGC11}$ and $V_{AGC21}$ increase. Therefore, an increased current flows into the pnp-type transistors Q100 to Q103, and an increased current flows into the constant-current source FET's Q5 and Q17, too. As will be obvious from the above description, the preceding amplifier 14a and the succeeding amplifier 14b exhibit increased voltage gains, and the voltage amplitude is maintained constant across the load resistance $R_l$.

According to the embodiment of FIG. 10, it was confirmed that signals of the GHz band, e.g., optical transmission electric signals of the band of about 2.4 GHz are amplified over a wide band maintaining a maximum gain of GVmax ≃48 dB through a multi-stage amplifier 14. Furthermore, a maximum gain GVmax is obtained through a multi-stage amplifier having a relatively small number of cascade connections. Therefore, the cut-off frequency related to the gain from the total input to the total output of the multi-stage amplifier can be heightened, so that the multi-stage amplifier will operate over a wide band.

On the other hand, it has been widely known to improve distortion characteristics and to carry out the low power supply voltage operation by adding a constant-current circuit that works as a current by-passing means to a transistor amplifier circuit that employs bipolar transistors as amplifying elements, as disclosed in Japanese Pat. Laid-Open No. 104549/1974 since before the filing date of the present application. According to this prior art, the transistor operates on base-input and emitter-common basis. The emitter current (bias current) of the transistor is set to a large value to improve distortion characteristics that stem from base-emitter voltage $V_{BE}$ vs. emitter current $I_E$ non-linear characteristics of the transistor. Further, a constant-current circuit is connected in parallel with at least either one of the emitter resistance or the collector load resistance of the transistor, to by-pass part of a heavy bias current. Therefore, a DC voltage drop decreases across both ends of the emitter resistance or the collector load resistance, and the transistor amplifying circuit is permitted to operate on relatively a small power source voltage.

As described above, the prior art disclosed in Japanese Pat. Laid-Open No. 104549/1974 has an object of improving distortion characteristics of a transistor amplifying circuit employing bipolar transistors as amplifying elements and of operating the transistor amplifying circuit on a low power source voltage, and can be distinguished from the object of the present invention which is to provide an amplifying circuit which exhibits a large gain and which operates over a wide band.

According to an embodiment of the present invention, a gain of $$\sqrt{\frac{I_O + 2I_1}{I_O}}$$

times as great is obtained in compliance with the equation (5) and the gain is varied if the drain constant current $I_1$ is increased with respect to the signal current $I_O$. When $I_O=1$ mA as shown in FIG. 4, the gain is three times as great as that of when $I_1=4$ mA and is five times as great as that of when $I_1=12$ mA. By adding a constant-current source circuit having a current control terminal, furthermore, the amplifier is constituted whose gain can be varied. In this method of increasing the gain, the load resistance $R_L$, signal current $I_O$ and gate width of the transistor are not changed, and the band width in theory is not at all shortened by the change in the gain. Furthermore since a gain is obtained which is three to five times and great as that of the conventional circuit, there is no need of greatly increasing the number of cascade connections of the multi-stage amplifier. Therefore, the band width is not narrowed by the multi-stage cascade connection, and a sufficiently broad band is maintained.

What is claimed is:

1. A wide-band and high-gain amplifying circuit comprising:
   (1) a first FET and a second FET whose sources are differentially connected to each other;
   (2) a load means connected to the drain of one of said first FET and said second FET; and
   (3) a current by-passing means which is connected to said drain and to said load means, and which permits a current to flow by-passing said load means to increase the conductance of either one of said FET's.

2. A wide-band and high-gain amplifying circuit according to claim 1, wherein the drain of either one of said FET's is connected to a first operating potential via said load means, and the sources of said first and second FET's are connected to a second operating potential via a common impedance means.

3. A wide-band and high-gain amplifying circuit according to claim 2, wherein said current by-passing means is constituted by a first constant-current source circuit, and said common impedance means is constituted by a second constant-current source circuit.

4. A wide-band and high-gain amplifying circuit according to claim 3, wherein a first constant current of the first constant-current source circuit is variably set by a first gain control signal, and a second constant current of the second constant-current source circuit is variably set by a second gain control signal.

5. A differential amplifier comprising:
   (1) first and second amplifying elements having grounding electrodes are connected to each other so as to operate differentially in response to an input signal;
   (2) first and second additional amplifying elements having grounding electrodes connected to the output electrodes of said first and second amplifying elements and whose input electrodes are connected to a predetermined DC potential;

(3) first and second load means whose ends on one side are connected to the output electrodes of said first and second additional amplifying elements and whose ends on the other side are connected to a first operating potential;

(4) a common impedance means connected between a second operating potential and said grounding electrodes of said first and second amplifying elements;

(5) a first current by-passing means connected to a common connection node of said output electrode of said first amplifying element and said grounding electrode of said first additional amplifying element; and (6) a second current by-passing means connected to a common connection node of said output electrode of said second amplifying element and said grounding electrode of said second additional amplifying element.

6. A differential amplifier according to claim 5, wherein said first and second current by-passing means are constituted by first and second constant-current source circuits, respectively, and said common impedance means is constituted by a third constant-current source circuit.

7. A differential amplifier according to claim 6, wherein the first constant current of said first constant-current source circuit and the second constant current of said second constant-current source circuit are variably set by a first gain control signal, and the third constant current of said third constant-current source circuit is variably set by a second gain control signal.

8. A differential amplifier according to claim 6, wherein a signal of the common connection node of said one end of said first load means and said output electrode of said first additional amplifying element is input to a first impedance converting means that has a high input impedance and a low output impedance, and a signal of the common connection node of said one end of said second load means and said output electrode of said second additional amplifying element is input to a second impedance converting means that has a high input impedance and a low output impedance.

9. A differential amplifier according to claim 8, wherein said first and second amplifying elements, as well as said first and second additional amplifying elements are MESFET's in a GaAsIC, and wherein said first impedance means includes a first source follower MESFET and the second impedance means includes a second source follower MESFET.

10. An optical communications system comprising:
(1) an optical transmission path which receives an optical input signal through an end thereof and which sends an optical output signal through the other end thereof;
(2) a photoelectronic converting means which converts said optical output signal into an electric signal; and (3) a multi-stage amplifier for amplifying said electric signal;

wherein the amplifier of at least one stage in said multi-stage amplifier is constituted by a differential amplifier comprising:

first and second amplifying elements whose grounding electrodes are connected to each other so as to operate differentially in response to an input signal, first and second additional amplifying elements whose grounding electrodes are connected to the output electrodes of said first and second amplifying elements and whose input electrodes are connected to a predetermined DC potential, first and second load means whose ends on one side are connected to the output electrodes of said first and second additional amplifying elements and whose ends on the other side are connected to a first operating potential, a common impedance means connected between a second operating potential and said grounding electrodes of said first and said second amplifying elements, a first current by-passing means connected to a common connection node of said output electrode of said first amplifying element and said grounding of said first additional amplifying element, and a second current by-passing means connected to a common connection node of said output electrode of said second amplifying element and said grounding electrode of said second additional amplifying element, wherein said first and second current by-passing means are constituted by first and second constant-current source circuits, respectively, and said common impedance means is constituted by a third constant-current source circuit, wherein a signal of the common connection node of said one end of said first load means and said output electrode of said first additional amplifying element is input to a first impedance converting means that has a high input impedance and a low output impedance, and a signal of the common connection node of said one end of said second load means and said output electrode of said second additional amplifying element is input to a second impedance converting means that has a high impedance and a low output impedance, and wherein said first and second amplifying elements, as well as said first and second additional amplifying elements are MESFETs in a GaAsIC, and wherein said first impedance means includes a first source follower MESFET and the second impedance means includes a second source follower MESFET.

11. An optical communications system according to claim 10, wherein a preceding amplifier and a succeeding amplifier of said multi-stage amplifier are integrated in said GaAsIC.

* * * * *